United States Patent
Huang et al.

(10) Patent No.: US 12,362,721 B2
(45) Date of Patent: Jul. 15, 2025

(54) TRANSFORMER-BASED MARCHAND BALUN AMPLIFIER FOR WIRELESS COMMUNICATION

(71) Applicants: Swiftlink Technologies Co., Ltd., Suzhou (CN); Swiftlink Technologies Inc., Richmond (CA)

(72) Inventors: Min-Yu Huang, Richmond (CA); Ayman Eltaliawy, Richmond (CA); Srinaga Nikhil Nallandhigal, Richmond (CA)

(73) Assignee: SWIFTLINK TECHNOLOGIES INC., Richmond (CA)

( * ) Notice: Subject to any disclaimer, the term of this patent is extended or adjusted under 35 U.S.C. 154(b) by 745 days.

(21) Appl. No.: 17/584,694

(22) Filed: Jan. 26, 2022

(65) Prior Publication Data
US 2023/0238937 A1    Jul. 27, 2023

(51) Int. Cl.
*H03H 7/42* (2006.01)
*H03F 3/45* (2006.01)
*H04B 1/40* (2015.01)

(52) U.S. Cl.
CPC ........... *H03H 7/42* (2013.01); *H03F 3/45475* (2013.01); *H04B 1/40* (2013.01); *H03F 2200/09* (2013.01); *H03F 2200/294* (2013.01); *H03F 2200/451* (2013.01); *H03F 2200/541* (2013.01); *H03F 2203/45228* (2013.01); *H03F 2203/45731* (2013.01)

(58) Field of Classification Search
CPC .......... H03F 2200/09; H03F 2200/451; H03F 2200/541; H03F 3/45475; H03F 2203/45228; H03F 2203/45731; H03H 7/42

USPC ......................................................... 330/296
See application file for complete search history.

(56) References Cited

U.S. PATENT DOCUMENTS

| | | | |
|---|---|---|---|
| 7,724,484 B2 * | 5/2010 | Bahl ..................... | H01P 5/028 361/111 |
| 9,312,815 B2 | 4/2016 | Wang et al. | |
| 9,331,664 B2 * | 5/2016 | Bouisse ................. | H03F 3/19 |

(Continued)

FOREIGN PATENT DOCUMENTS

WO    WO-2020126054 A1 *    6/2020

*Primary Examiner* — Andrea Lindgren Baltzell
*Assistant Examiner* — Lance Torbjorn Bartol
(74) *Attorney, Agent, or Firm* — WOMBLE BOND DICKINSON (US) LLP

(57) ABSTRACT

An amplifier includes a first and a second differential input ports, and a single-ended output port. The amplifier includes a first and a second transistors, each having a gate, source, and drain terminals. The source terminals are coupled to a reference plane and the gate terminals are coupled to the respective first and second differential input ports. The amplifier includes a Balun having a primary and a secondary transformer winding, the primary transformer winding having one end coupled to the drain terminal of the first transistor, an opposite end coupled to the drain terminal of the second transistor, and a center tap coupled to a bias voltage, and the secondary transformer winding is adjacent to the primary transformer winding and having one end coupled to the single-ended output port and an opposite end open circuited. An electromagnetic field generated at the primary induces a signal at the secondary transformer winding.

20 Claims, 15 Drawing Sheets

(56) References Cited

U.S. PATENT DOCUMENTS

| | | | |
|---|---|---|---|
| 10,200,009 B2* | 2/2019 | Abdalla | H03H 11/32 |
| 10,355,678 B2 | 7/2019 | Ye et al. | |
| 2010/0255805 A1* | 10/2010 | Chandler | H04B 1/00 |
| | | | 455/272 |
| 2023/0134681 A1* | 5/2023 | Outaleb | H03F 3/195 |
| | | | 342/372 |

* cited by examiner

TRANSFORMER-BASED MARCHAND BALUN AMPLIFIER FOR WIRELESS COMMUNICATION

FIELD OF THE INVENTION

Embodiments of the present invention relate generally to wireless communication devices. More particularly, embodiments of the invention relate to a transformer-based Marchand Balun amplifier for wireless communication.

BACKGROUND

With the persistent market demand for higher data rates, target precision, compact systems, and so on, wireless research is rapidly progressing to embrace the millimeter-wave (mmW) and beyond frequency bands. These bands are inherently capable of satisfying these requirements and thereby support the emerging applications such as 5G new radio, automotive radar, mmW imaging, high speed indoor communications, and beyond.

In wireless communication devices, balanced (differential) amplifiers are commonly used in both the radio frequency (RF) and the intermediate frequency (IF) signal chains in the wireless transceivers. For example, differential amplifiers can be implemented as low-noise amplifiers in the receive front-end chain, power amplifiers in the transmit front-end chain, or Intermediate-Frequency (IF) voltage amplifiers in the back-end chain. Differential amplifiers are less sensitive to power supply noise and provide better linearity performance compared to single-ended amplifiers. Differential amplifiers can be employed with a differential-to-differential signal scheme, or a differential to single-ended signal scheme.

To employ differential amplifiers in the differential to single-ended signal scheme, differential amplifiers are typically frequency-tuned using passive transformers. However, the passive transformers are narrow band devices, and thus, reduces an operating bandwidth of the differential amplifiers.

A circuit diagram of a conventional differential to single-ended amplifier is shown in FIGS. 5A-B. Referring to FIGS. 5A-B, amplifier 500 includes a balanced pair of active transistors (501, 503) and a differential-to-single-ended transformer 505. The transistor pairs (501, 503) are in a common source configuration having Source(S) terminals coupled to a reference ground. The gate (G) terminals of the balanced active transistors (501, 503) are coupled to balanced input generator sources (507, 509). Note that input generator sources (507, 509) are typically available in differential form with a generator impedance of ($2*Z_{gen}$), i.e., approximately 100Ω differential, where $Z_{gen}$ is typically 50Ω.

The Drain (D) terminals of transistors (501, 503) are coupled to differential-to-single-ended transformer 505, where the singled-end output of transformer 505 is coupled to a load impedance $Z_L$ and is at voltage $V_o$. Note that the output single-ended load impedance $Z_L$ is typically 50Ω, but can be any resistance values. In this case, transformer 505 can be used to transform an impedance of the active transistors (501, 503) seen by the load impedance $Z_L$ to a matching impedance of 50Ω to maximize the power transfer or minimize signal reflection from the load impedance $Z_L$. This matching procedure, however, results in a narrowband response for amplifier 500 since the frequency response of amplifier 500 is limited by the impedance transformation ratio (e.g., ratio of the primary windings to secondary windings of a transformer) and the transformer bandwidth of transformer 505.

FIG. 5C shows a wideband amplifier 550 design of a differential transformer cascaded with a Balun 553. A Balun is a passive electrical component that allows balanced and unbalanced lines to be interfaced. Here, the impedance transformation can be split into two matching networks (i.e., a differential transformer 551 and a Balun 553). This configuration can be designed for a wider bandwidth compared to the design shown in FIGS. 5A-B, however, a power loss from the impedance transformation of amplifier 550 is expected to be greater than that of amplifier 500, since two cascaded passive components (551, 553) are used for the impedance matching for amplifier 550 instead of one cascaded component (505) for amplifier 500.

FIG. 9 illustrates a circuit diagram of a conventional differential-to-single IF amplifier for a case study. Amplifier 900 includes a balanced 50-Ω resistance input matching network 901, a common-source transistor pair (501, 503), and a balanced inductor LT output matching network 903. Bypass capacitors $C_{bp}$ are used to block the DC biasing.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
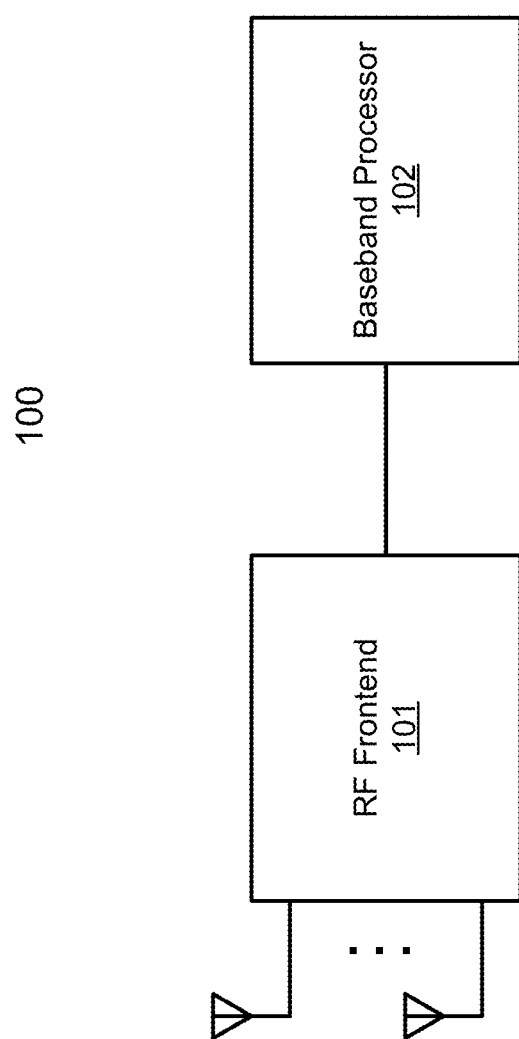
FIG. 1 is a block diagram illustrating an example of a wireless communication device according one embodiment.

Various embodiments and aspects of the inventions will be described with reference to details discussed below, and the accompanying drawings will illustrate the various embodiments, where like reference numerals refer to like parts throughout the various figures unless otherwise specified. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Note that in the corresponding drawings of the embodiments, signals are represented with lines. Some lines may be thicker or have a slash over the lines, to indicate more constituent signal paths, such as a differential signal, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. The term "substantially" herein refers to being within 10% of the target.

Embodiments of the specification disclose a transformer-based Marchand Balun differential-to-single-ended differential amplifier. The co-designed transformer-based Marchand Balun differential-to-single-ended differential amplifier includes a Marchand Balun structure serving as a matching transformer for the transistors of the amplifier and a Balun simultaneously. Since Marchand Baluns are inherently broadband, the co-design leads to a broadband differential-to-single-ended differential amplifier.

Embodiments disclose a co-design of a tranformer-based Marchand Balun structure with a different-to-single amplifier. The broadband matching technique can be applied to any amplifier in the Tx/Rx chain of a transceiver, such as, low noise amplifier, power amplifier, or IF variable-gain amplifiers (VGA).

According to a first aspect, a single-stage amplifier includes a first and a second differential input ports, and a single-ended output port. The amplifier includes a first transistor with a gate, source, and drain terminals, where the source terminal is coupled to a reference plane and the gate terminal is coupled to the first differential input port. The amplifier includes a second transistor with a gate, source, and drain terminals, where the source terminal is coupled to the reference plane and the gate terminal is coupled to the second differential input port. The amplifier includes a Balun having a primary transformer winding and a secondary transformer winding, the primary transformer winding having one end coupled to the drain terminal of the first transistor, an opposite end coupled to the drain terminal of the second transistor, and a center tap coupled to a bias voltage, and the secondary transformer winding adjacent to the primary transformer winding and having one end coupled to the single-ended output port and an opposite end open circuited.

In one embodiment, the Balun is a transformer-based Marchand Balun. In one embodiment, the first and second transistors of the amplifier are on-chip components. In one embodiment, the Marchand Balun is co-designed with the amplifier on-chip. Among different Balun configurations, transformer based Marchand Balun promises a wide-band response and impedance transformation. Thus, the co-design of a transformer-based Marchand Balun amplifier has a larger bandwidth compared with a conventional differential-to-single amplifier with minimal passive components for minimal power loss in impedance matching.

In one embodiment, the primary transformer winding of the Marchand Balun is divided into a first and a second intermediate transformer windings by the center tap and the first and second intermediate transformer windings are quarter wavelength windings.

In one embodiment, the first and second intermediate transformer windings are planar spiral-shaped transmission lines and the first intermediate transformer winding is at an opposite end from the second intermediate transformer winding to reduce self-coupling between the first and second intermediate transformer windings.

In one embodiment, the primary and secondary transformer windings are transmission lines at a signal plane separate from the reference plane. In one embodiment, the signal plane is a metal layer or multiple metal layers. In one embodiment, the Marchand Balun has an operating frequency between approximately 3 to 12 GHz and having a dimension of approximately 600 μm by 310 μm.

In one embodiment, the primary transformer winding of the Marchand Balun includes two quarter wavelength transmission lines of a first line thickness and the secondary transformer winding of the Balun includes a half wavelength transmission line of a first line thickness or a second line thickness. In one embodiment, an operating frequency bandwidth of the amplifier is approximately 3.45 to 19.05 GHz. In one embodiment, a fraction bandwidth of the amplifier is approximate 150 percent.

According to a second aspect, a radio frequency (RF) transceiver includes an intermediate amplifier to amplify a differential signal. The amplifier includes a first and a second differential input ports, and a single-ended output port. The amplifier includes a first transistor with a gate, source, and drain terminals, where the source terminal is coupled to a reference plane and the gate terminal is coupled to the first differential input port. The amplifier includes a second transistor with a gate, source, and drain terminals, where the source terminal is coupled to the reference plane and the gate terminal is coupled to the second differential input port. The amplifier includes a Marchand Balun having a primary transformer winding and a secondary transformer winding, the primary transformer winding having one end coupled to the drain terminal of the first transistor, an opposite end coupled to the drain terminal of the second transistor, and a center tap coupled to a bias voltage, and the secondary transformer winding adjacent to the primary transformer winding and having one end coupled to the single-ended output port and an opposite end open circuited.

According to a third aspect, a radio frequency (RF) front-end includes one or more RF transceivers, each RF transceiver includes an intermediate amplifier to amplify a differential signal. The amplifier includes a first and a second differential input ports, and a single-ended output port. The amplifier includes a first transistor with a gate, source, and drain terminals, where the source terminal is coupled to a reference plane and the gate terminal is coupled to the first differential input port. The amplifier includes a second transistor with a gate, source, and drain terminals, where the source terminal is coupled to the reference plane and the gate terminal is coupled to the second differential input port. The amplifier includes a Marchand Balun having a primary transformer winding and a secondary transformer winding, the primary transformer winding having one end coupled to the drain terminal of the first transistor, an opposite end coupled to the drain terminal of the second transistor, and a center tap coupled to a bias voltage, and the secondary transformer winding adjacent to the primary transformer winding and having one end coupled to the single-ended output port and an opposite end open circuited.

FIG. 1 is a block diagram illustrating an example of a wireless communication device according one embodiment of the invention. Referring to FIG. 1, wireless communication device 100, also simply referred to as a wireless device, includes, amongst others, an RF frontend module 101 and a baseband processor 102. Wireless device 100 can be any kind of wireless communication devices such as, for example, mobile phones, laptops, tablets, network appliance devices (e.g., Internet of thing or IOT appliance devices), etc.

In a radio receiver circuit, the RF frontend is a generic term for all the circuitry between the antenna up to and including the mixer stage. It consists of all the components in the receiver that process the signal at the original incoming radio frequency, before it is converted to a lower frequency, e.g., IF. In microwave and satellite receivers it is often called the low-noise block (LNB) or low-noise downconverter (LND) and is often located at the antenna, so that the signal from the antenna can be transferred to the rest of the receiver at the more easily handled intermediate frequency. A baseband processor is a device (a chip or part of a chip) in a network interface that manages all the baseband processing functions to process baseband signals.

In a radio transmitter circuit, the RF frontend is a generic term for all the circuitry between the mixer stage up to and including the antenna. It consists of all the components in the transmitter that processes the signal at the more easily handled intermediate frequency, IF, before it is converted to a radio frequency, e.g., RF, for transmission. In microwave and satellite transmitters it is often called the block upconverter (BUC), which makes up the "transmit" side of the system, and is often used in conjunction with an LNB, which makes up the "receive" side of the system.

In one embodiment, RF frontend module 101 includes one or more RF transceivers, where each of the RF transceivers transmits and receives RF signals within a particular frequency band (e.g., a particular range of frequencies such as non-overlapped frequency ranges) via one of a number of RF antennas. The RF frontend IC chip further includes an IQ generator and/or a frequency synthesizer coupled to the RF transceivers. The IQ generator or generation circuit generates and provides an LO signal to each of the RF transceivers to enable the RF transceiver to mix, modulate, and/or demodulate RF signals within a corresponding frequency band. The RF transceiver(s) and the IQ generation circuit may be integrated within a single IC chip as a single RF frontend IC chip or package.

Figure 2:
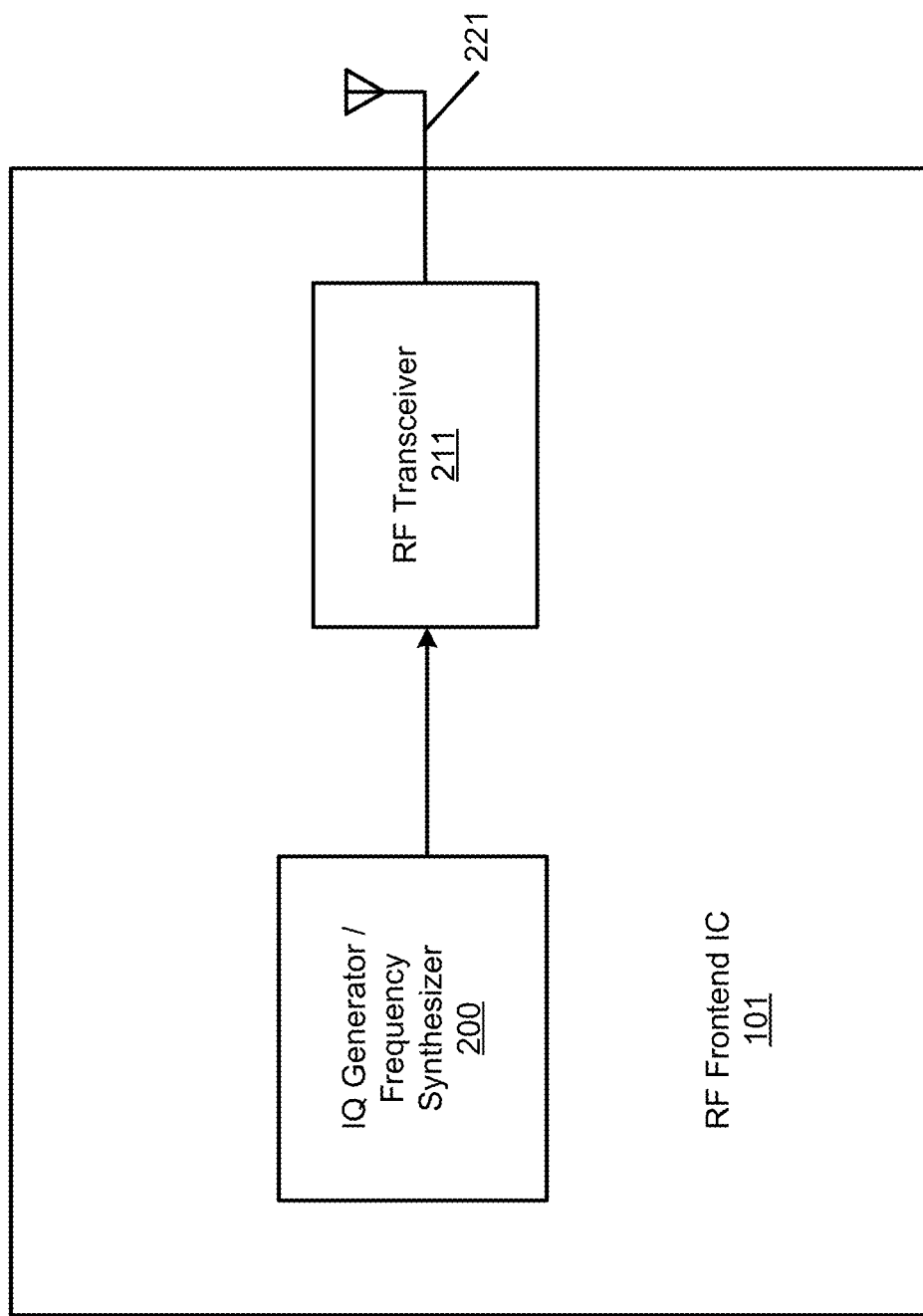
FIG. 2 is a block diagram illustrating an example of an RF frontend integrated circuit according to one embodiment.

FIG. 2 is a block diagram illustrating an example of an RF frontend integrated circuit according to one embodiment of the invention. Referring to FIG. 2, RF frontend 101 includes, amongst others, an IQ generator and/or frequency synthesizer 200 coupled to a RF transceiver 211. Transceiver 211 is configured to transmit and receive RF signals within one or more frequency bands or a broad range of RF frequencies via RF antenna 221. In one embodiment, transceiver 211 is configured to receive one or more LO signals from frequency synthesizer 200. The LO signals are generated for the one or more corresponding frequency bands. The LO signals are utilized to mix, modulate, demodulated by the transceiver for the purpose of transmitting and receiving RF signals within corresponding frequency bands. Although there is only one transceiver and antenna shown, multiple pairs of transceivers and antennas can be implemented, one for each frequency band.

Figure 3:
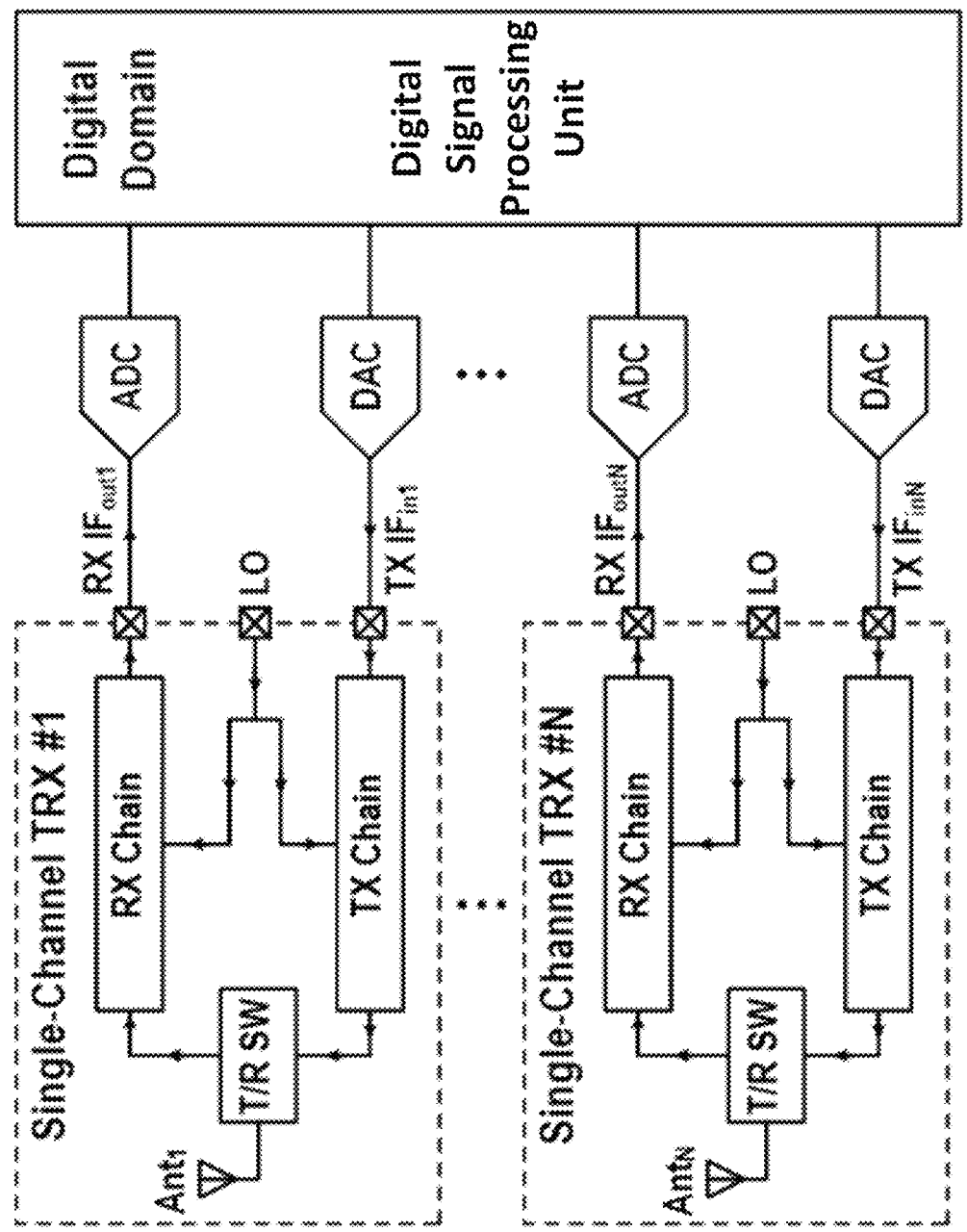
FIG. 3 is a block diagram illustrating an example of a transceiver according to one embodiment.

FIG. 3 is a block diagram illustrating an example of a transceiver according to one embodiment. Transceiver 300 may represent RF transceiver 211 of FIG. 2. Referring to FIG. 3, transceiver 300 includes a number of single-channel transceivers (e.g., single-channel TRX #1 . . . single-channel TRX #N), analog-digital converters (ADCs), digital-analog converters (DACs), and a digital signal processing unit. The digital signal processing unit can process digital signals in a digital domain. The single-channel transceivers each can include an up-conversion TX chain, a down-conversion RX chain, a T/R switch, and an antenna. The single-channel transceivers can each receive/transmit a respective analog stream simultaneously from/to one or more remote devices (e.g., a cellular mobile device, user equipment, and/or a cellular mobile device site) independent of the rest of the single-channel transceivers. Each of the ADCs can convert an analog signal to a digital signal. Each of the DACs can convert a digital signal to an analog signal. As shown, pairs of ADCs and DACs are coupled to each one of the single-channel transceivers to convert data streams from/to an analog domain to/from the digital domain. In one embodiment, the DSP unit is configured to generate a first set of digital data streams simultaneously and each of the first set of digital data streams is converted by a respective one of the DACs into an analog data stream to be transmitted to a remote device by a respective one of the single-channel transceivers.

In one embodiment, the single-channel transceivers, e.g., single-channel TRX #1 . . . single-channel TRX #N, have identical channels. In one embodiment, the RF frontend circuit is part of a cellular handheld user mobile device. In another embodiment, the RF frontend circuit is part of a cellular mobile device site which can stream data to one or more cellular handheld user mobile devices. In another embodiment, the identical channels can stream data to one or more cellular handheld user mobile devices by transmitting and receiving a respective independent data streams.

In one embodiment, the single-channel transceivers each can include an antenna which can include a directional antenna. The directional antenna of each of the single-channel transceivers can correspond to a different radiation angle or a similar radiation angle in comparison with the other directional antennas of the RF frontend. For example, different radiation angles can track a user moving within many corresponding radiation angles while similar radiation angles can track two or more users moving within a corresponding radiation angle or similar radiation angles.

In one embodiment, the DSP unit is further configured to receive a second set of digital data streams from the ADCs. In one embodiment, each of the second set of digital data streams is received by a respective one of the single-channel transceiver via a specific radiation angle. In one embodiment, the second set of digital data streams can be received simultaneously. In one embodiment, the second set of digital data streams are synchronized in time. In one embodiment, the first set of digital streams are synchronized in time.

Figure 4:
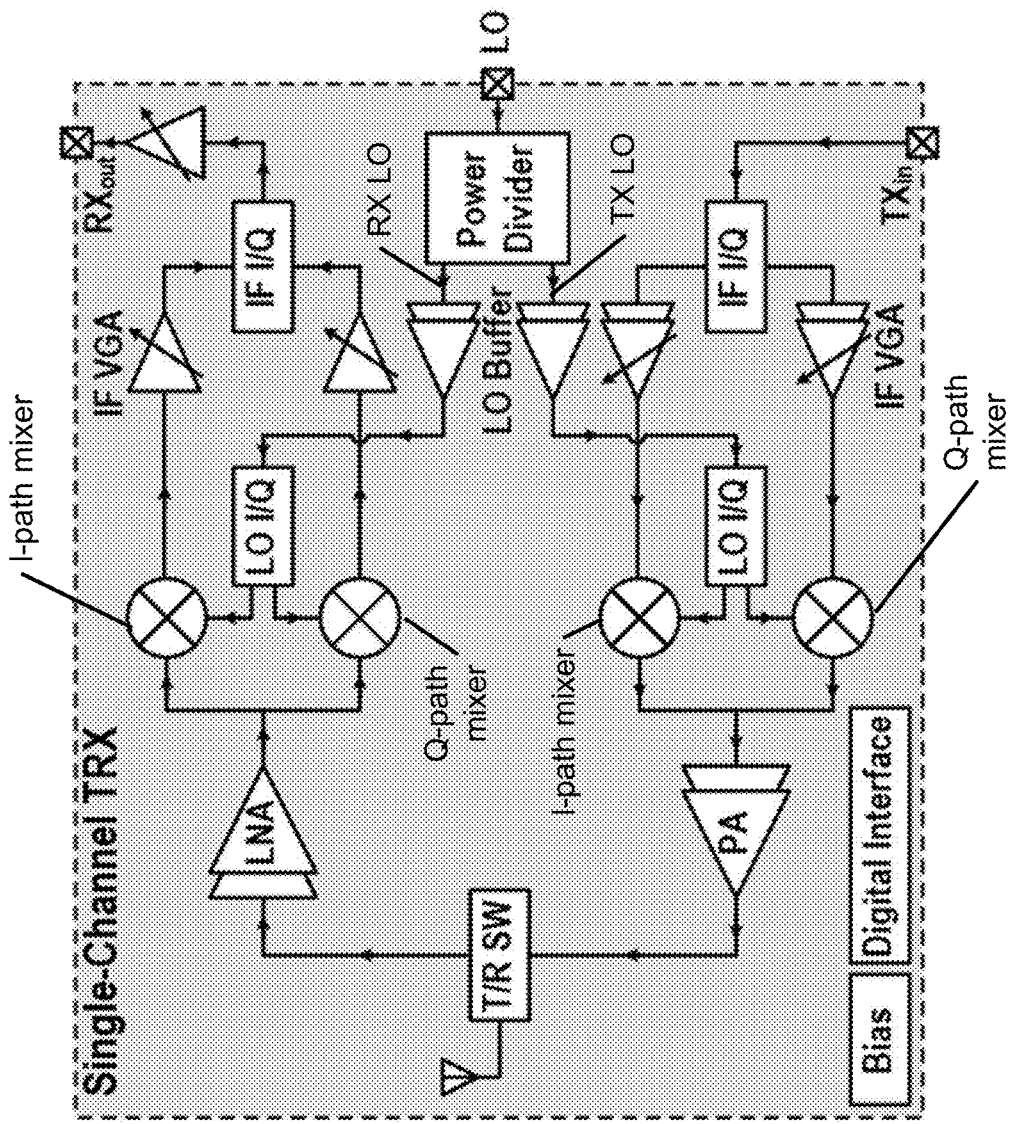
FIG. 4 is a block diagram illustrating an example of a single-channel transceiver circuit according to one embodiment.
Figure 5B:
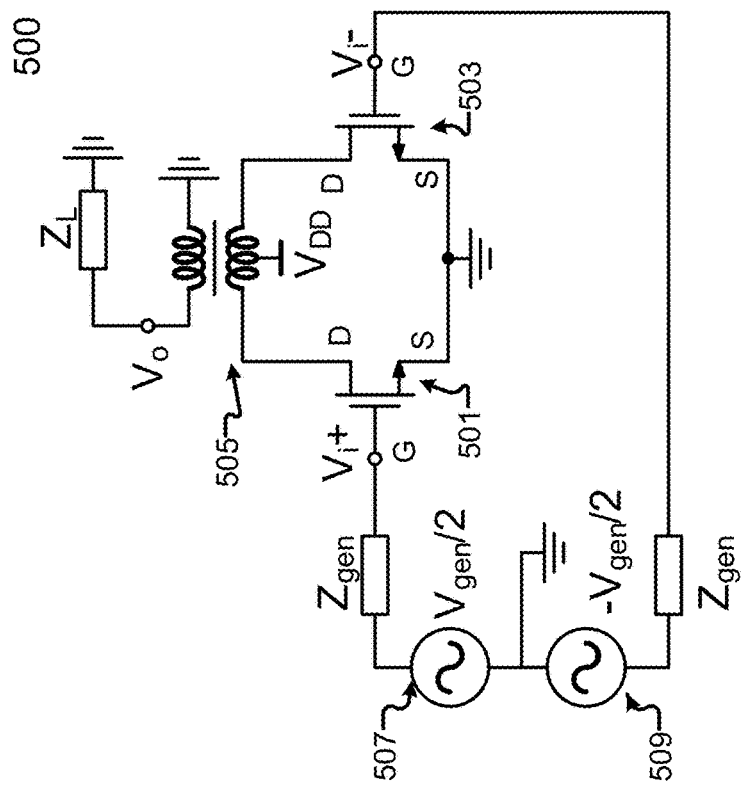
FIGS. 5A-5B illustrate circuit diagrams of a differential-to-single amplifier with a passive transformer.
Figure 5A:
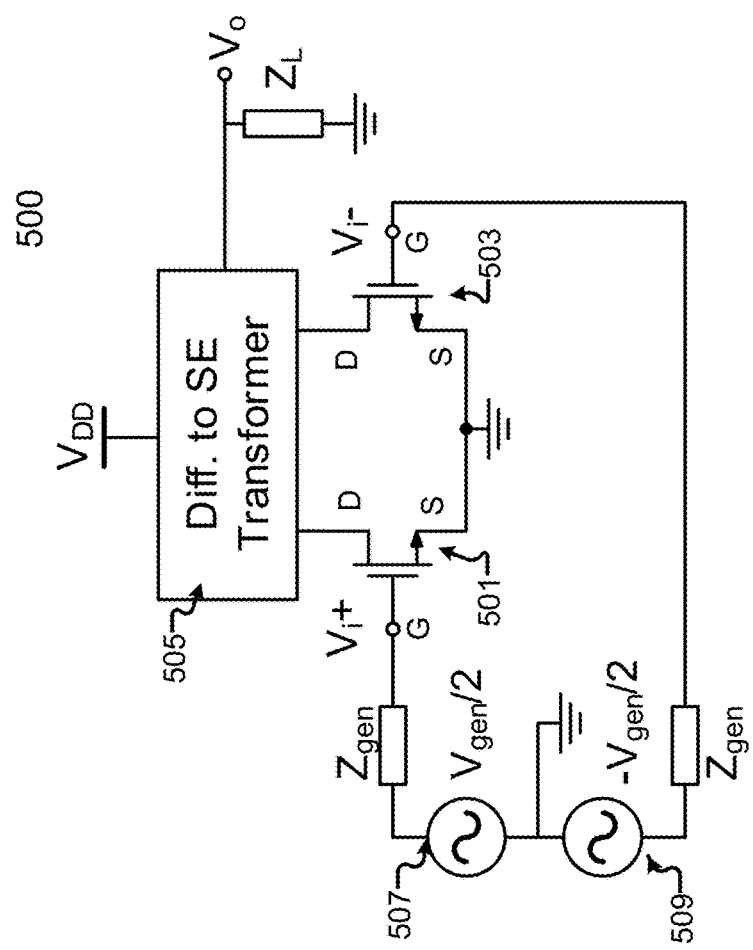
Figure 5C:
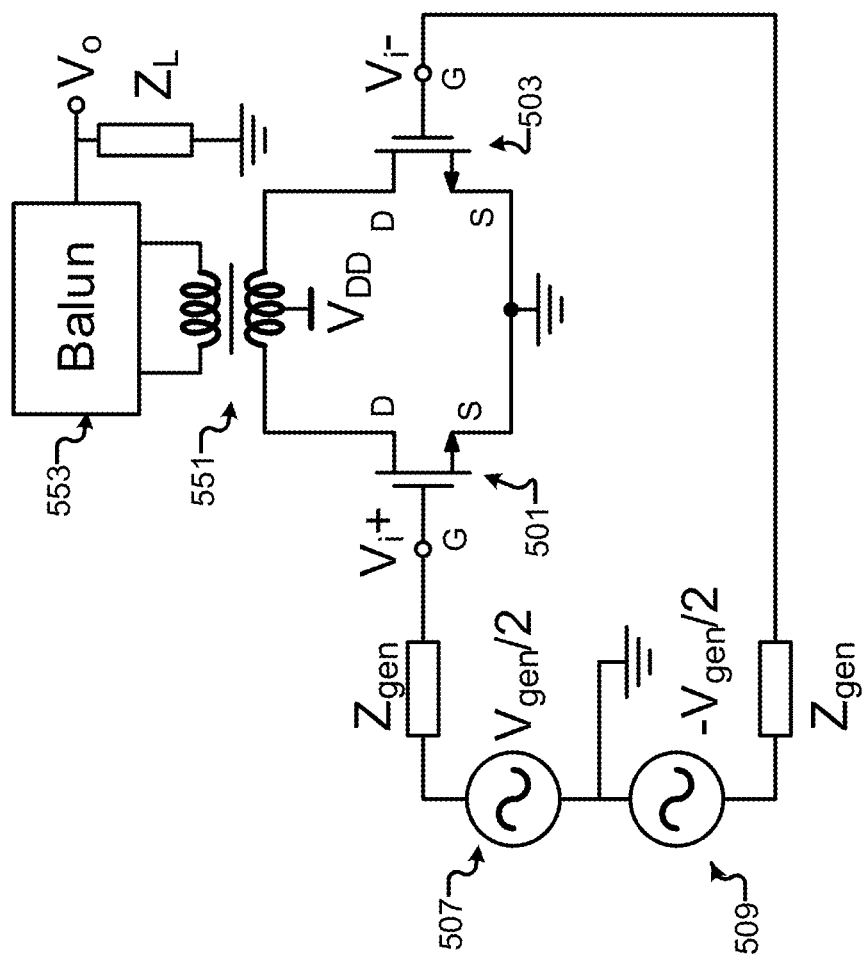
FIG. 5C illustrates a circuit diagram of a differential-to-single amplifier with a passive transformer and a Balun.

FIG. 4 is a block diagram illustrating an example of a single-channel transceiver circuit according to one embodiment. Referring to FIG. 4, single-channel transceiver 400 may represent single-channel TRX #1 of FIG. 3. Transceiver 400 is configured to transmit/receive RF signals for a single-channel. The single-channel can be a single frequency channel. In one embodiment, in the TX chain, transceiver 400 can include a power amplifier (PA), in-phase/quadrature (I/Q) up-conversion mixer(s), a local oscillator (LO) buffer, a LO I/Q generation network, IF variable-gain amplifiers (VGAs), and an IF I/Q generation network. The TX chain can include two paths, 1) I path for processing in-phase component signals and 2) Q-path for processing quadrature component signals. In one embodiment, IF I/Q quadrature network can generate a I component signal and a Q component signal based on an intermediate signal to be transmitted (e.g., TXin signal). The I and Q component signals can be further amplified by IF VGA. Up-conversion mixers for each of the I-path and the Q-path receives the amplified I and Q component signals and the LO I/Q signals (generated by the LO I/Q generation network based on an TX LO signal) and mixes/modulates the IF I/Q-path component signals to a higher frequency band. The higher frequency I and Q component signals are then recombined and amplified by the PA before being transmitted to the antenna via a T/R switch to be radiated by the antenna.

In one embodiment, for the RX chain, transceiver 400 can include a low-noise amplifier (LNA), I/Q down-conversion mixer(s), a LO buffer, an LO I/Q quadrature generation network, an IF I/Q quadrature generation network, and IF VGAs. The TX chain and RX chain can be coupled by a T/R switch, which is coupled to the antenna. Similar to the TX chain, the RX chain can include two paths, 1) I path for processing in-phase component signals and 2) Q-path for processing quadrature component signals. In one embodiment, the RX chain receives an RF signal, via the antenna, from a remote device and the RF signal is amplified by the LNA (which may or may not include a band pass filter). The I-path down-convert mixer and the Q-path down-convert mixer mixes/demodulates the RF signal into I-path signals and Q-path signals using the LO I/Q components (e.g., generated by LO I/Q generation network based on an RX LO signal). The I-path and Q-path signals can be further amplified by I-path and Q-path IF VGAs. The IF I/Q quadrature generation network can then generate an RXout signal based on the amplified I-path and Q-path signals. In one embodiment, the RXout signal may be further amplified by additional amplifiers or VGAs.

In one embodiment, the TX LO and RX LO signals are generated by an on-chip LO power divider using an LO signal. The LO signal may be provided by a crystal oscillator. In one embodiment, the TX LO and RX LO signals are buffered by LO buffers. In one embodiment, the single-channel TRX includes a bias interface which can provide bias voltage sources for the single-channel TRX. In another embodiment, a pair of ADC and DAC are integrated with the single-channel TRX and the single-channel TRX can include a digital interface to interface with the digital domain of a digital signal processing unit (such as the digital signal processing unit of FIG. 3).

In some embodiments, the circuit blocks (T/R switch, mixers, LNA, PA, IF VGA, etc.) of transceiver 400 are single-ended units. In some embodiments, a subset of the circuit blocks (T/R switch, mixers, LNA, PA, IF VGA, etc.) of transceiver 400 are differential units employing a differential-to-differential scheme or differential to single-ended scheme. Instead of singled-ended signals that is referenced to a fixed potential (ground), differential circuits use differential signals, that are measured between two nodes that have equal and opposite signal excursions about a fixed potential. Differential signals can reject common noise from the environment and the power supply of the integrated circuits.

Figure 6B:
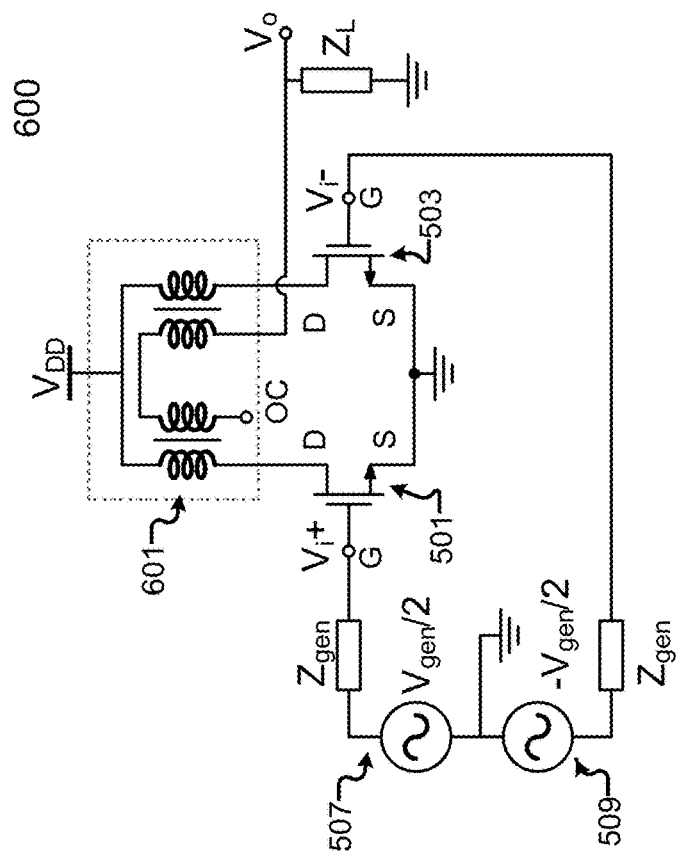
FIGS. 6A-6B illustrate circuit diagrams of a differential-to-single amplifier with a transformer-based Marchand Balun according to one embodiment.
Figure 6A:
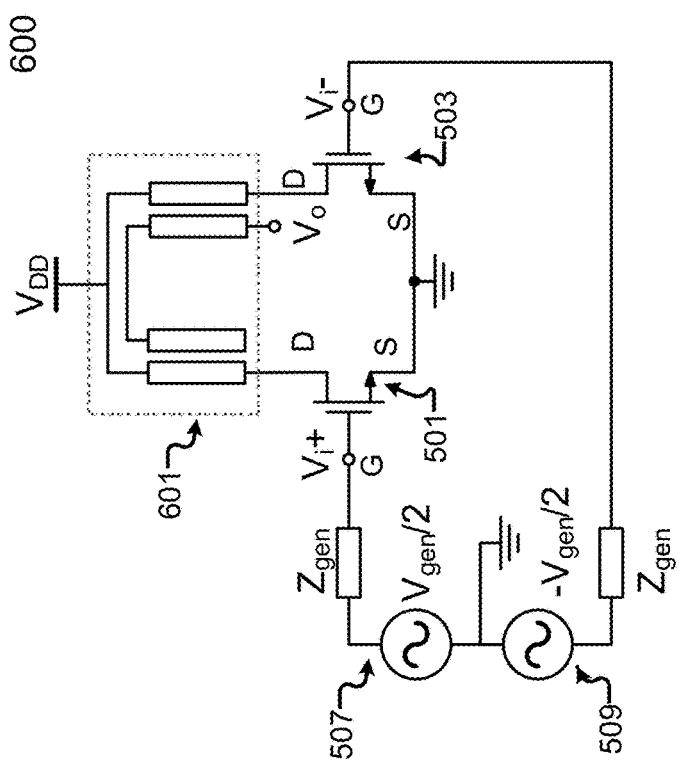

FIGS. 6A-B show an implementation of a transformer-based Marchand balun amplifier 600. Amplifier 600 can represent LNA, PA, and/or IF VGA of FIG. 4. Amplifier 600 can include a Marchand balun 601, where Marchand balun 601 can include two tightly coupled transmission lines. The tightly coupled transmission lines can be adjacent to one another where an electromagnetic field generated by a first transmission line (e.g., primary winding) induces a signal on a second transmission line (e.g., secondary winding), or vice versa. A differential winding (primary winding) of Marchand balun 601 can be connected to the pair of active transistors (501, 503) of amplifier 600 and the bias supply voltage VDD at the center, while one end of the single-ended Marchand balun winding (secondary winding) is connected to an output node $V_o$ and the other end of the single-ended Marchand balun winding (secondary winding) is left open circuit.

Figure 7A:
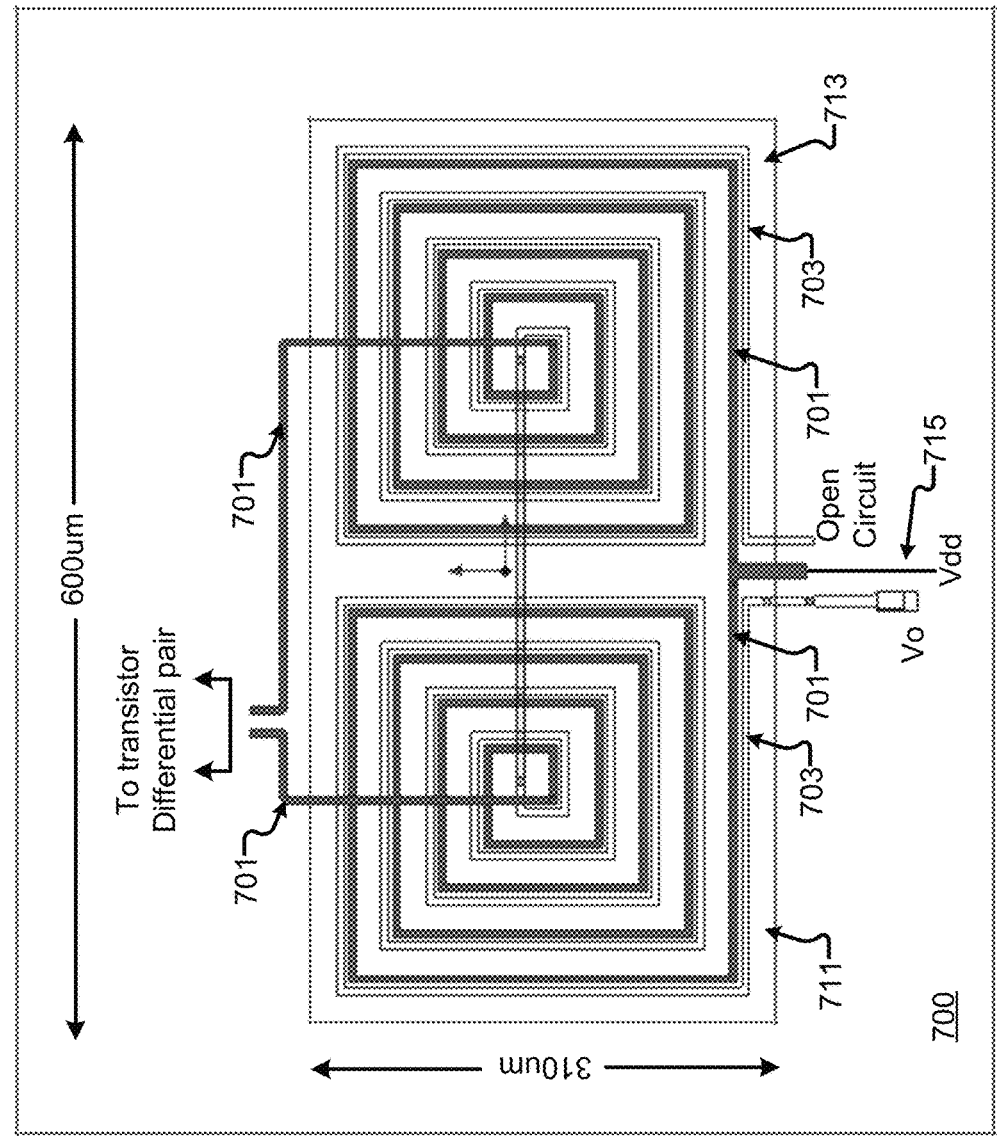
FIG. 7A illustrates a top view of a transformer-based Marchand Balun.
Figure 7B:
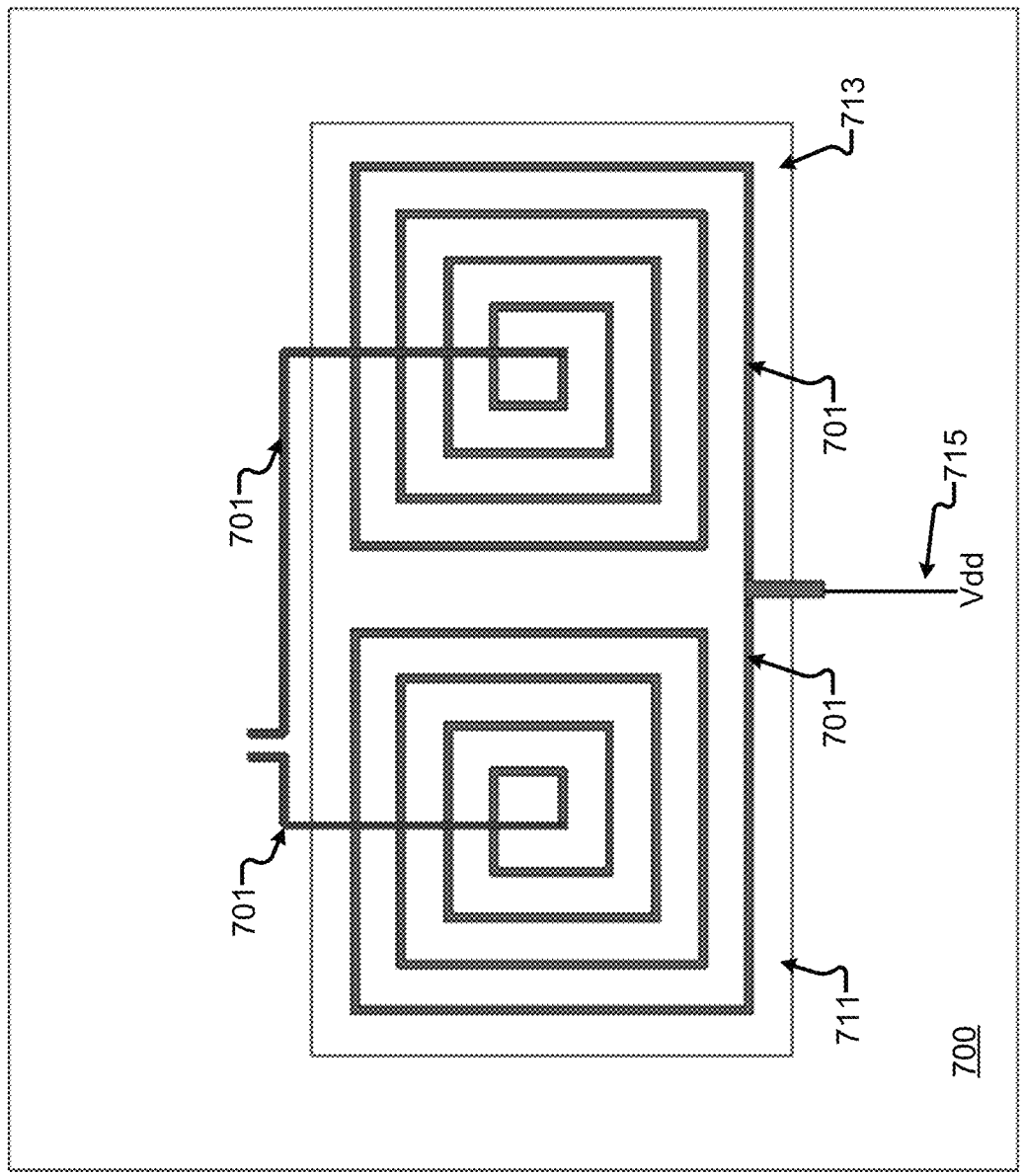
FIG. 7B illustrates the primary winding.
Figure 7C:
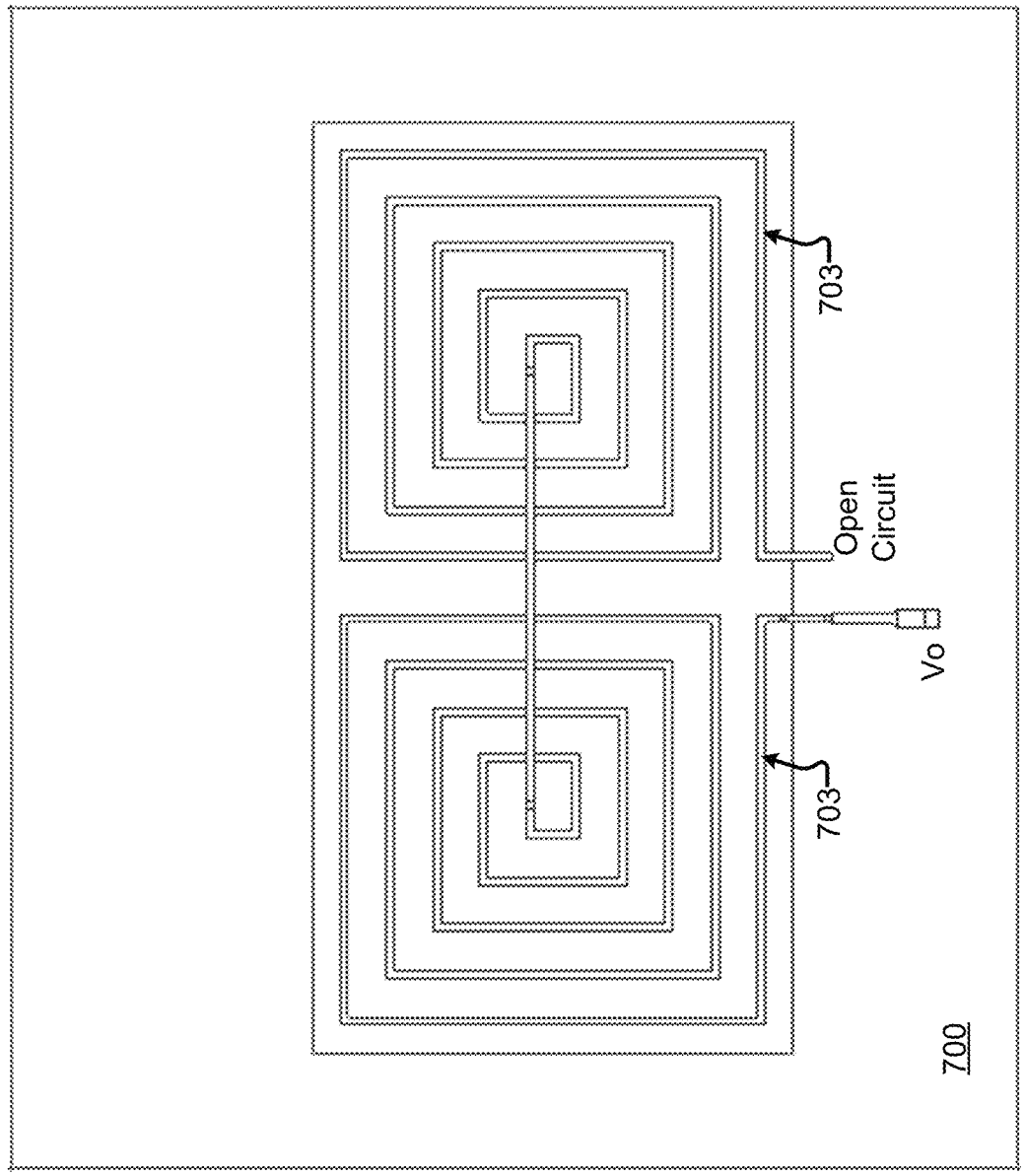
FIG. 7C illustrates the secondary winding.
Figure 7D:
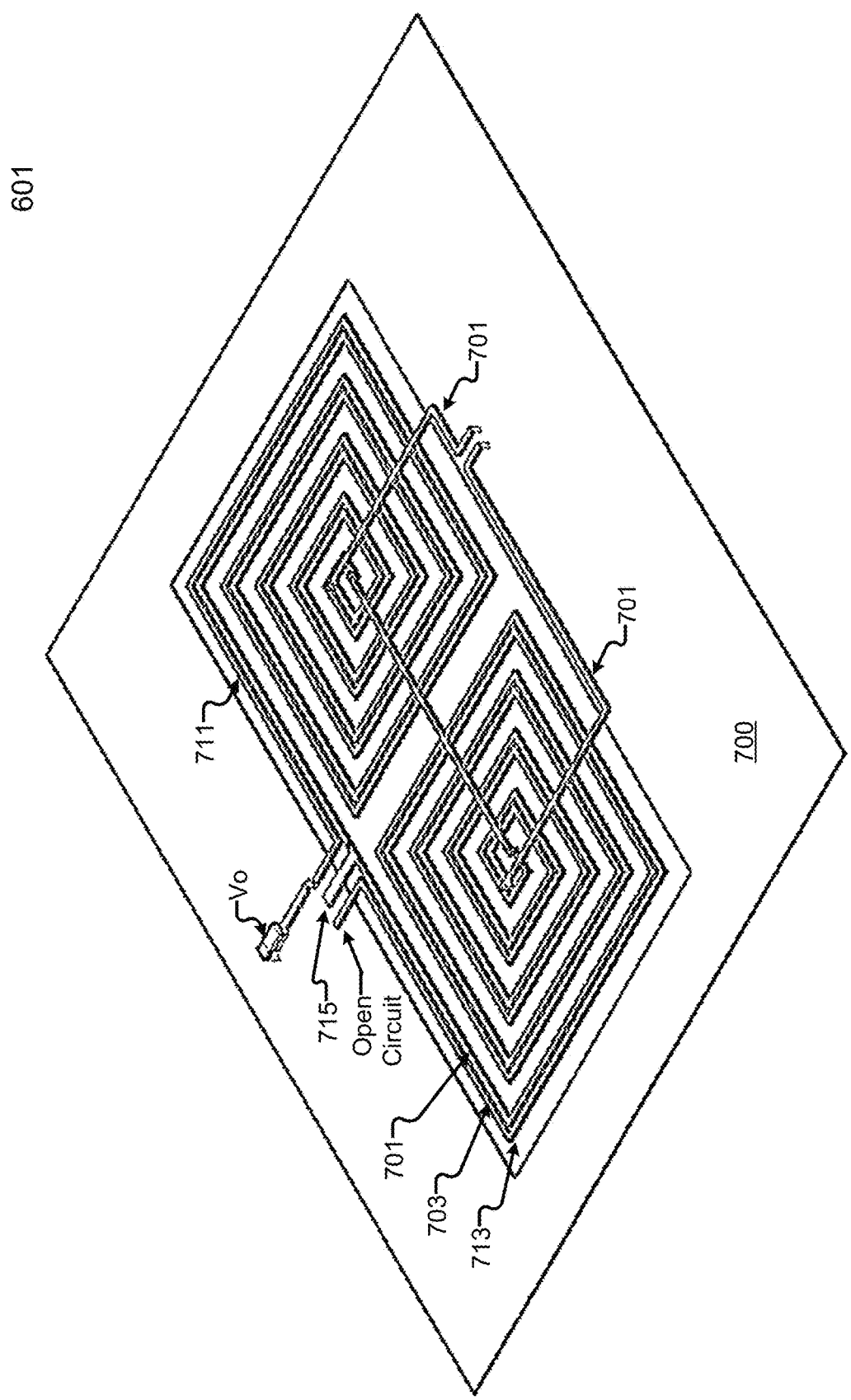
FIG. 7D illustrates a perspective view of the transformer-based Marchand Balun, according to one embodiment.

FIGS. 7A-7D illustrate an IF Marchand Balun 601 with an operating frequency range of 3 to 12 GHz. Marchand Baluns inherently have a wide-band frequency response. The wide-band differential to single-ended transformation, or vice versa, is achieved through open and short circuits of the Marchand Baluns and therefore the bandwidth is frequency independent. Balun 601 can be co-designed with any IF components in the RX/TX signal chains to operate at the frequency range of 3 to 12 GHz. As illustrated in FIGS. 7A-7D, Marchand Balun 601 includes a first transmission line (primary winding 701 as shown in FIG. 7B) 701 adjacent to a second transmission line (secondary winding 703 as shown in FIG. 7C) 703. The primary winding 701 is divided into a quarter wavelength left spiral 711 and a quarter wavelength right spiral 713. During operation, a center tap 715 of primary winding 701 is coupled to a supply voltage $V_{dd}$ to provide a bias voltage for Marchand Balun 601. The secondary winding 703 is placed adjacent to primary winding 701 and has one end coupled to output port $V_o$ and an opposite end open circuit (OC). In one embodiment, first and second transmission lines (701, 703) are situated on a single signal plane, or are situated on separate signal planes. The primary and secondary windings (701, 703) are surrounded by ground plane 700.

For this implementation, Marchand balun 601 has a compact footprint with a 2-D dimension of approximately 310 µm by 600 µm. Marchand Balun 601 can be co-designed with amplifier 600 of FIG. 6A, e.g., amplifier 600 with a 1000 differential matching impedance connected to the gate terminals of differential transistor pair (501, 503) and having a 5002 single-end impedance matching at $V_o$ with a coupling loss less than 3 dB over a 100% fractional bandwidth. Although, 100 Ω differential input impedance and 50 Ω load impedance are shown in FIG. 6B, amplifier 600 can have other resistance values for the input and/or load impedances. Simulation results for such an amplifier are further shown in FIG. 11. Marchand Balun 601 can be similarly co-designed with any of the RF components in the TX/RX chain (e.g., LNA, PA, etc.). For example, Marchand Balun 601 can be designed to operate at a mmW or beyond RF frequency range, such as 20 to 30 GHz, 36-84 GHz. In such a design, the primary and secondary transmission lines may be shorter, and the number of turns in the primary and secondary windings can be less than that shown in FIG. 7A, e.g., 2-4 turns. The transmission line length can be determined using equation c=fλ, where c is speed of light, f is the target frequency, and 2 is a distance of one wavelength.

Note that in this example, the transmission line has been described and shown as in a square spiral shape. However, other spiral shapes, such as a circular spiral shape, a rectangular spiral shape, may also be applicable.

Figure 8:
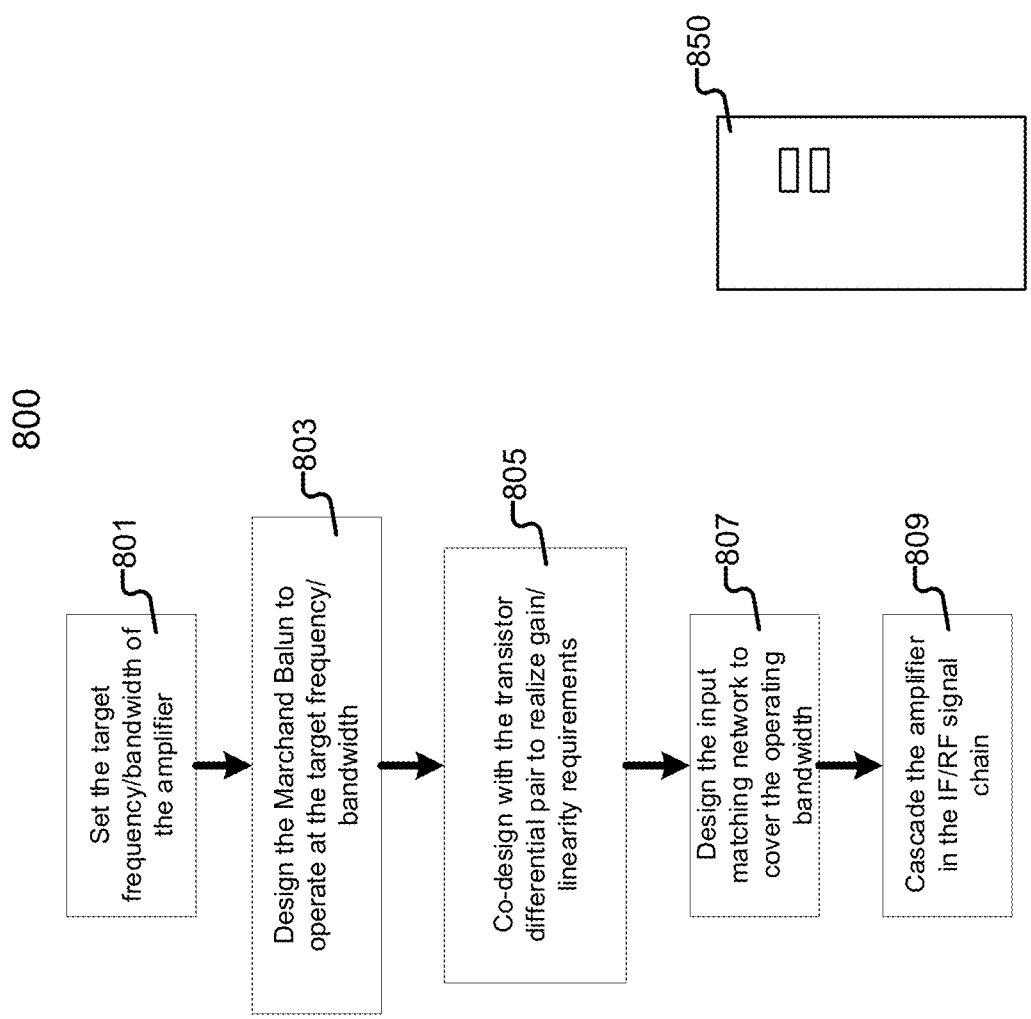
FIG. 8 illustrates a flow diagram of a design procedure for a transformer-based Marchand Balun differential-to-single amplifier according to one embodiment.

FIG. 8 is a flow diagram illustrating a process to design a transformer-based Marchand Balun differential-to-single amplifier according to one embodiment. Process 800 may be performed by processing logic of computer 850 which may include software, hardware, or a combination thereof. Referring to FIG. 8, at operation 801, processing logic determines a target operating frequency/bandwidth of the amplifier. For example, the target bandwidth can be 3-12 GHz as that of the intermediate frequency operating range, or some other RF frequency range, e.g., 20-30 GHz, 36-84 GHZ, etc. The target operating frequency can be set at the center frequency of the frequency operating range, e.g., 7.5 GHZ, 25 GHz, 60 GHz, etc.

At operation 803, processing logic determines a Marchand Balun layout that meets the operating frequency/bandwidth.

For example, Marchand Balun 601 of FIGS. 7A-7D can be used as a reference layout, and processing logic can determine the lengths for the transmission lines of the primary and secondary windings using equation c-f), where c is speed of light, and f is the target frequency, and 2 is a distance of a wavelength. From a known 2, the quarter wavelength segments of the primary transmission line is λ/4, and the two segments of the secondary transmission line is λ/4. Processing logic can then iterate through different number of spiral turns using the determined lengths of the primary and secondary windings to determine respective bandwidths. Processing logic can then select a layout that meets the target bandwidth.

At operation 805, processing logic integrates a pair of transistors in common source configuration with the selected Balun layout from operation 803, and determines a bias voltage ($V_{dd}$) that would realize a desirable gain linearity for the amplifier.

At operation 807, processing logic selects an input matching network that meets the target frequency/bandwidth. For example, a matching passive RLC network can be coupled to the gate terminals of the pair of transistors of the amplifier for impedance matching at the gate terminals. An example of a balanced RLC matching network is further shown in RLC network 901 of FIG. 10.

At operation 809, processing logic cascades the amplifier with the input matching network into an IF/RF signal chain, such as LNA, PA, and/or IF VGA in the TX/RX signal chain of transceiver 400 of FIG. 4.

Figure 9:
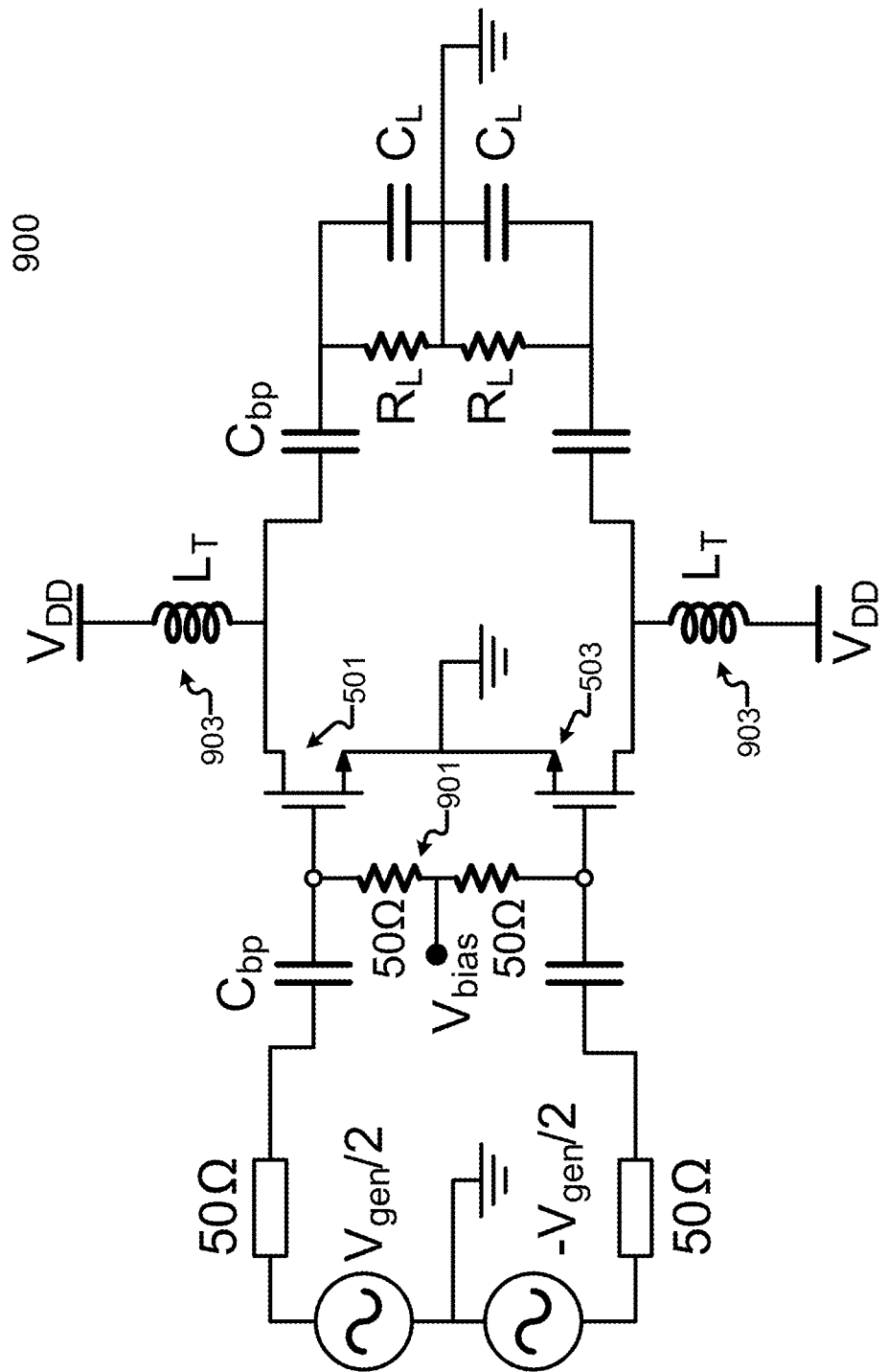
FIG. 9 illustrates a circuit diagram of a conventional differential-to-single IF amplifier.
Figure 10:
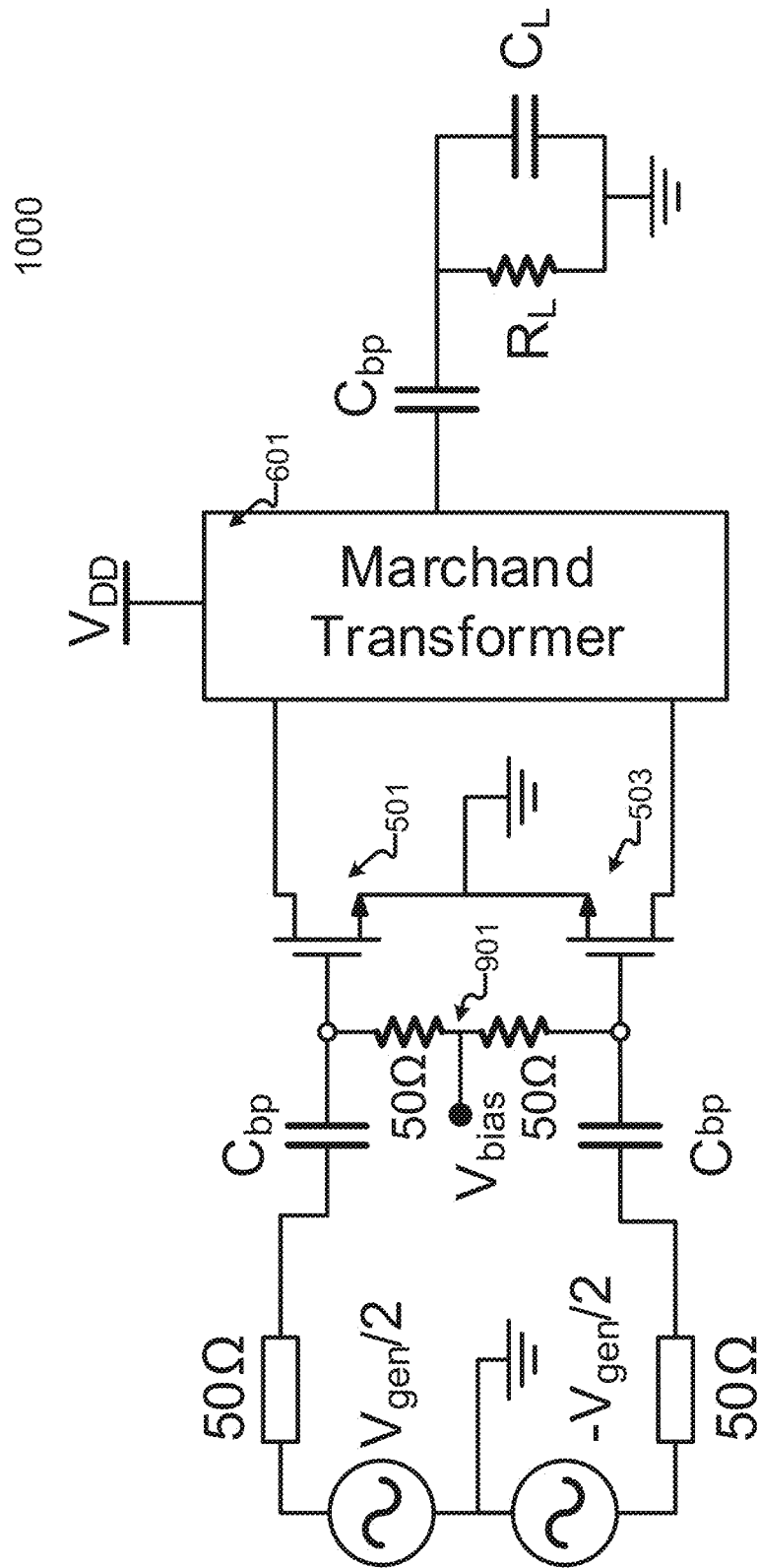
FIG. 10 illustrates a circuit diagram of a transformer-based Marchand Balun differential-to-single IF amplifier according to one embodiment.

FIG. 10 shows a transformer-based Marchand Balun IF amplifier 1000 according to one embodiment. Amplifier 1000 is similar to amplifier 900 of FIG. 9 but includes a differential transistor pair loaded with a Marchand balun 601 as differential-to-single-ended tunable transformer coupled to the load impedance, e.g., the $R_L C_L$ load network.

Figure 11:
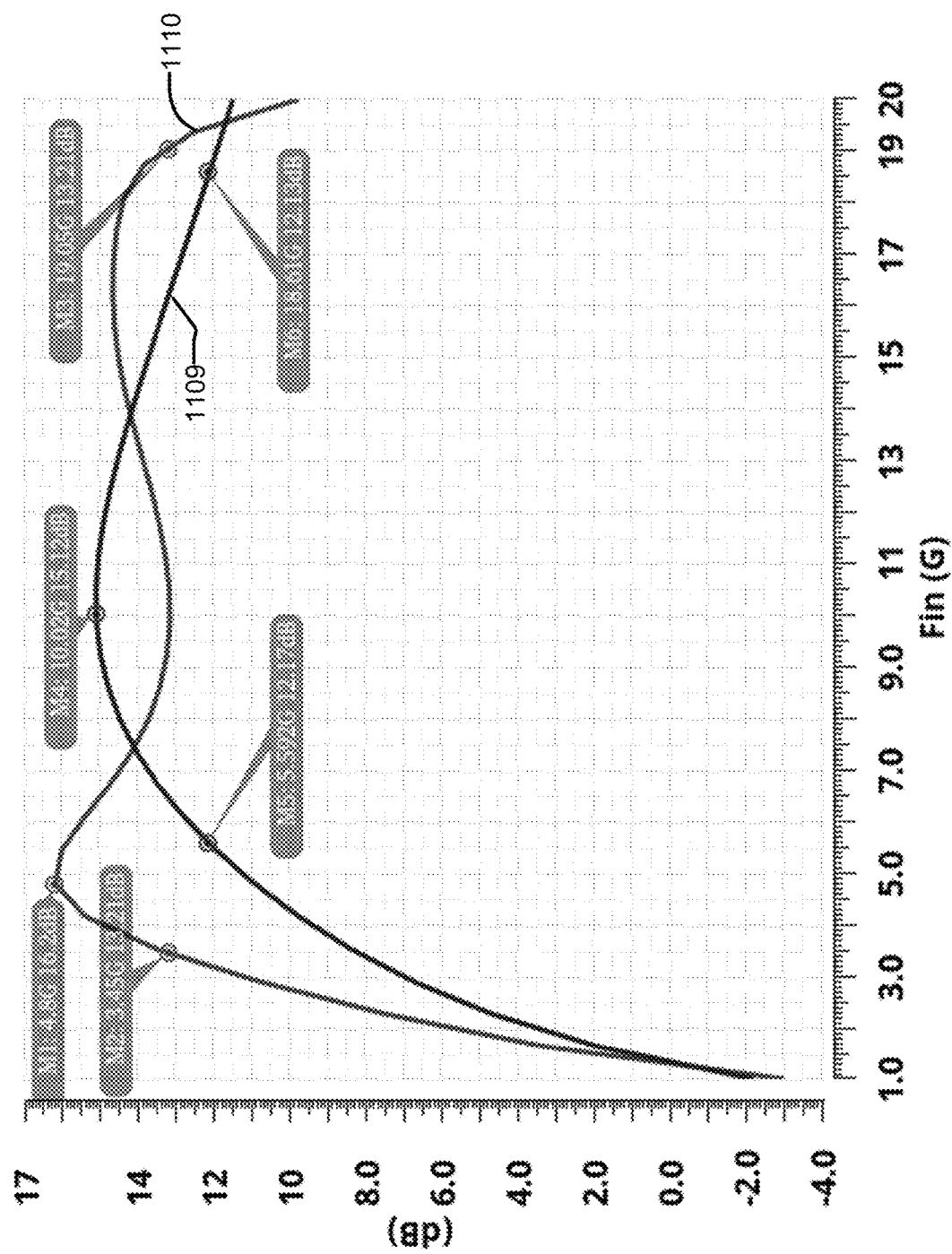
FIG. 11 illustrates simulation results of the transformer-based Marchand Balun differential-to-single IF amplifier of FIG. 10 compared with the conventional IF amplifier of FIG. 9, according to one embodiment.

FIG. 11 illustrates simulation result of the transformer-based Marchand Balun differential-to-single IF amplifier 1000 of FIG. 10 compared with amplifier 900 of FIG. 9, according to one embodiment. As shown in FIG. 11, the simulation results include two frequency response plots (1110, 1109) with x-axis denoting the input frequency and the y-axis denoting the dB gain of the amplifiers. Plot 1110 corresponds to IF amplifier 1000 of FIG. 10 and plot 1109 corresponds to IF amplifier 900 of FIG. 9. As shown, both amplifiers have similar amplification gains (approximately 14 dB). Plot 1110 indicates that transformer-based Marchand Balun IF amplifier 1000 has a wider operating bandwidth (3.45 to 19.05 GHz) than that of the conventional IF amplifier (5.59 to 18.61 GHz). The plot 1110 also has a better gain flatness across the operating frequency bandwidth than plot 1109.

Although the case study of FIG. 9 illustrates a differential-to-single amplifier, the Marchand Balun of FIG. 7A-7D can be coupled to other components of the Rx/Tx signal chain. For example, the Marchand Balun can be coupled to the T/R switch, buffer, LO I/Q, mixer, etc. of FIG. 4.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A single-stage amplifier, comprising:
   a first and a second differential input ports, and a single-ended output port;
   a first transistor with a first gate, first source, and first drain terminals, wherein the first source terminal is coupled to a reference plane and the first gate terminal is coupled to the first differential input port;
   a second transistor with a second gate, second source, and second drain terminals, wherein the second source terminal is coupled to the reference plane and the second gate terminal is coupled to the second differential input port; and
   a Balun co-designed with the amplifier, the Balun comprising:
   a primary transformer winding having one end coupled to the first drain terminal of the first transistor, an opposite end coupled to the second drain terminal of the second transistor, and a center tap coupled to a bias voltage; and
   a secondary transformer winding adjacent to the primary transformer winding and having one end coupled to the single-ended output port and an opposite end open circuited, wherein an electromagnetic field generated at the primary transformer winding induces a signal at the secondary transformer winding, wherein the primary transformer winding of the Balun co-designed with the amplifier serves as a matching transformer for the first and second transistors of the amplifier, wherein an operating frequency bandwidth of the amplifier is approximately 3.45 Gigahertz (GHz) to 19.05 GHz.

2. The amplifier of claim 1, wherein the primary transformer winding of the Balun is divided into a first and a second intermediate transformer windings by the center tap and the first and second intermediate transformer windings are quarter wavelength windings.

3. The amplifier of claim 2, wherein the first and second intermediate transformer windings are planar transmission lines and the first intermediate transformer winding is at an opposite end from the second intermediate transformer winding to reduce self-coupling between the first and second intermediate transformer windings.

4. The amplifier of claim 1, wherein the Balun is an on-chip transformer-based Marchand Balun and the first and second transistors of the amplifier are on-chip components.

5. The amplifier of claim 1, wherein the primary and secondary transformer windings are transmission lines at a signal plane separate from the reference plane.

6. The amplifier of claim 5, wherein the signal plane is a metal layer or two or more metal layers.

7. The amplifier of claim 1, wherein the primary transformer winding of the Balun comprises two quarter wavelength transmission lines of a first line length and the secondary transformer winding of the Balun comprises a half wavelength transmission line of the first line length or a second line length.

8. The amplifier of claim 1, where the primary transformer winding of the Balun comprises two quarter wavelength transmission lines of a first line thickness and the secondary transformer winding of the Balun comprises a half wavelength transmission line of the first line thickness or a second line thickness.

9. The amplifier of claim 1, wherein the amplifier is an intermediate frequency variable gain amplifier of a transceiver.

10. The amplifier of claim 9, wherein the amplifier amplifies a signal in a signal chain of a transceiver.

11. A radio frequency (RF) transceiver comprising an intermediate amplifier to amplify a differential signal, the intermediate amplifier comprising:
a first and a second differential input ports, and a single-ended output port;
a first transistor with a first gate, first source, and first drain terminals, wherein the first source terminal is coupled to a reference plane and the first gate terminal is coupled to the first differential input port;
a second transistor with a second gate, second source, and second drain terminals, wherein the second source terminal is coupled to the reference plane and the second gate terminal is coupled to the second differential input port; and
a Balun co-designed with the amplifier, the Balun comprising:
a primary transformer winding having one end coupled to the first drain terminal of the first transistor, an opposite end coupled to the second drain terminal of the second transistor, and a center tap coupled to a bias voltage; and
a secondary transformer winding adjacent to the primary transformer winding and having one end coupled to the single-ended output port and an opposite end open circuited, wherein an electromagnetic field generated at the primary transformer winding induces a signal at the secondary transformer winding, wherein the primary transformer winding of the Balun co-designed with the amplifier serves as a matching transformer for the first and second transistors of the amplifier, wherein an operating frequency bandwidth of the amplifier is approximately 3.45 Gigahertz (GHz) to 19.05 GHz.

12. The RF transceiver of claim 11, wherein the primary transformer winding of the Balun is divided into a first and a second intermediate transformer windings by the center tap and the first and second intermediate transformer windings are quarter wavelength windings.

13. The RF transceiver of claim 12, wherein the first and second intermediate transformer windings are planar transmission lines and the first intermediate transformer winding is at an opposite end from the second intermediate transformer winding to reduce self-coupling between the first and second intermediate transformer windings.

14. The RF transceiver of claim 11, wherein the Balun is an on-chip transformer-based Marchand Balun and the first and second transistors of the amplifier are on-chip components.

15. The RF transceiver of claim 11, wherein the primary and secondary transformer windings are transmission lines at a signal plane separate from the reference plane.

16. The RF transceiver of claim 15, wherein the signal plane is a metal layer or two or more metal layers.

17. The RF transceiver of claim 11, wherein the primary transformer winding of the Balun comprises two quarter wavelength transmission lines of a first line length and the secondary transformer winding of the Balun comprises a half wavelength transmission line of the first line length or a second line length.

18. The RF transceiver of claim 11, where the primary transformer winding of the Balun comprises two quarter wavelength transmission lines of a first line thickness and the secondary transformer winding of the Balun comprises a half wavelength transmission line of the first line thickness or a second line thickness.

19. The RF transceiver of claim 11, wherein the amplifier is an intermediate frequency variable gain amplifier of a transceiver.

20. A radio frequency (RF) frontend comprising:
one or more RF transceivers, each RF transceiver having an intermediate amplifier to amplify a differential signal, the intermediate amplifier comprising:
a first and a second differential input ports, and a single-ended output port;
a first transistor with a first gate, first source, and first drain terminals, wherein the first source terminal is coupled to a reference plane and the first gate terminal is coupled to the first differential input port;
a second transistor with a second gate, second source, and second drain terminals, wherein the second source terminal is coupled to the reference plane and the second gate terminal is coupled to the second differential input port; and
a Balun co-designed with the amplifier, the Balun comprising:
a primary transformer winding having one end coupled to the first drain terminal of the first transistor, an opposite end coupled to the second drain terminal of the second transistor, and a center tap coupled to a bias voltage; and
a secondary transformer winding adjacent to the primary transformer winding and having one end coupled to the single-ended output port and an opposite end open circuited, wherein an electromagnetic field generated at the primary transformer winding induces a signal at the secondary transformer winding, wherein the primary transformer winding of the Balun co-designed with the amplifier serves as a matching transformer for the first and second transistors of the amplifier, wherein an operating frequency bandwidth of the amplifier is approximately 3.45 Gigahertz (GHz) to 19.05 GHz.

* * * * *